(12) United States Patent
Kumakura

(10) Patent No.: US 12,051,981 B2
(45) Date of Patent: Jul. 30, 2024

(54) POWER CONVERSION UNIT

(71) Applicant: NISSAN MOTOR CO., LTD., Yokohama (JP)

(72) Inventor: Susumu Kumakura, Kanagawa (JP)

(73) Assignee: NISSAN MOTOR CO., LTD., Yokohama (JP)

( * ) Notice: Subject to any disclaimer, the term of this patent is extended or adjusted under 35 U.S.C. 154(b) by 711 days.

(21) Appl. No.: 17/257,380

(22) PCT Filed: Jul. 3, 2018

(86) PCT No.: PCT/IB2018/000836
§ 371 (c)(1),
(2) Date: Dec. 31, 2020

(87) PCT Pub. No.: WO2020/008222
PCT Pub. Date: Jan. 9, 2020

(65) Prior Publication Data
US 2021/0376750 A1    Dec. 2, 2021

(51) Int. Cl.
*H02M 7/00* (2006.01)
*H05K 7/14* (2006.01)
*H05K 7/20* (2006.01)

(52) U.S. Cl.
CPC .......... *H02M 7/003* (2013.01); *H05K 7/1432* (2013.01); *H05K 7/20927* (2013.01)

(58) Field of Classification Search
CPC . H02M 7/003; H05K 7/1432; H05K 7/20927; H05K 7/14329
See application file for complete search history.

(56) References Cited

U.S. PATENT DOCUMENTS

| | | | |
|---|---|---|---|
| 2008/0236963 A1* | 10/2008 | Yasukawa | H01R 13/6215 361/624 |
| 2013/0077255 A1 | 3/2013 | Abe et al. | |
| 2014/0160822 A1* | 6/2014 | Kuwano | B60L 50/40 363/141 |
| 2016/0126808 A1 | 5/2016 | Nagao et al. | |
| 2017/0311457 A1 | 10/2017 | Kubota et al. | |
| 2019/0159367 A1 | 5/2019 | Umino | |
| 2022/0142014 A1* | 5/2022 | Ono | H02M 7/003 361/699 |

FOREIGN PATENT DOCUMENTS

| | | |
|---|---|---|
| CA | 3022357 A1 | 11/2017 |
| JP | 2003-324903 A | 11/2003 |
| JP | 2006-166604 A | 6/2006 |
| JP | 2008-245437 A | 10/2008 |
| JP | 2013-074671 A | 4/2013 |
| JP | 2013-084800 A | 5/2013 |

(Continued)

*Primary Examiner* — Kyle J Moody
(74) *Attorney, Agent, or Firm* — Foley & Lardner LLP

(57) ABSTRACT

A power conversion unit is provided with a power conversion module performing conversion between direct current power and alternating current power, a first bus bar connected to the power conversion module and inputting and outputting the power, a chassis housing the power conversion module, and a terminal connecting the first bus bar and a second bus bar connected to an external device. The terminal and at least a part of the chassis are integrally formed of a resin.

8 Claims, 10 Drawing Sheets

(56) References Cited

FOREIGN PATENT DOCUMENTS

| JP | 2014-236604 A | 12/2014 |
| JP | 2016-092931 A | 5/2016 |
| JP | 2016-100943 A | 5/2016 |
| JP | 2016-195078 A | 11/2016 |
| WO | WO-2017/187598 A1 | 11/2017 |

* cited by examiner

POWER CONVERSION UNIT

TECHNICAL FIELD

The present invention relates to a power conversion unit.

BACKGROUND ART

A power conversion unit is provided, in a chassis, with a power conversion module configured by an inverter and performing conversion between direct current power and alternating current power. The power conversion module has a bus bar (first bus bar) inputting and outputting direct current power and alternating current power. The first bus bar and a bus bar (second bus bar) provided in an external device are fastened to each other on a terminal which is a connection base.

For example, a power conversion unit disclosed in JP 2016-92931 A is configured integrally with an external device which is a motor, and in the power conversion unit, first bus bars of a power conversion module and second bus bars of the external device are fastened to each other on a terminal formed of a resin. The terminal is fixed to a metal chassis dividing the power conversion unit and the external device with a bolt or the like.

SUMMARY OF INVENTION

According to the technique of JP 2016-92931 A, in order to secure the insulation between the bus bars fixed onto the terminal and the metal chassis fixed to a lower portion of the terminal, the terminal needs to be increased in size such that the distance between the bus bars and the metal chassis is sufficiently large. Moreover, a space for fastening the terminal and the metal chassis with a bolt or the like is required in the power conversion unit, which poses a problem of an increase in size of the power conversion unit.

The present invention has been made in order to solve such a problem. It is an object to reduce the size of the power conversion unit.

According to one embodiment of this invention, a power conversion unit has a power conversion module performing conversion between direct current power and alternating current power; a first bus bar connected to the power conversion module and inputting and outputting the power; a chassis housing the power conversion module; and a terminal connecting the first bus bar and a second bus bar connected to an external device. The terminal and at least a part of the chassis are integrally formed of a resin.

DESCRIPTION OF EMBODIMENTS

A power conversion unit according to embodiments of the present invention is described.

First Embodiment

Figure 1:
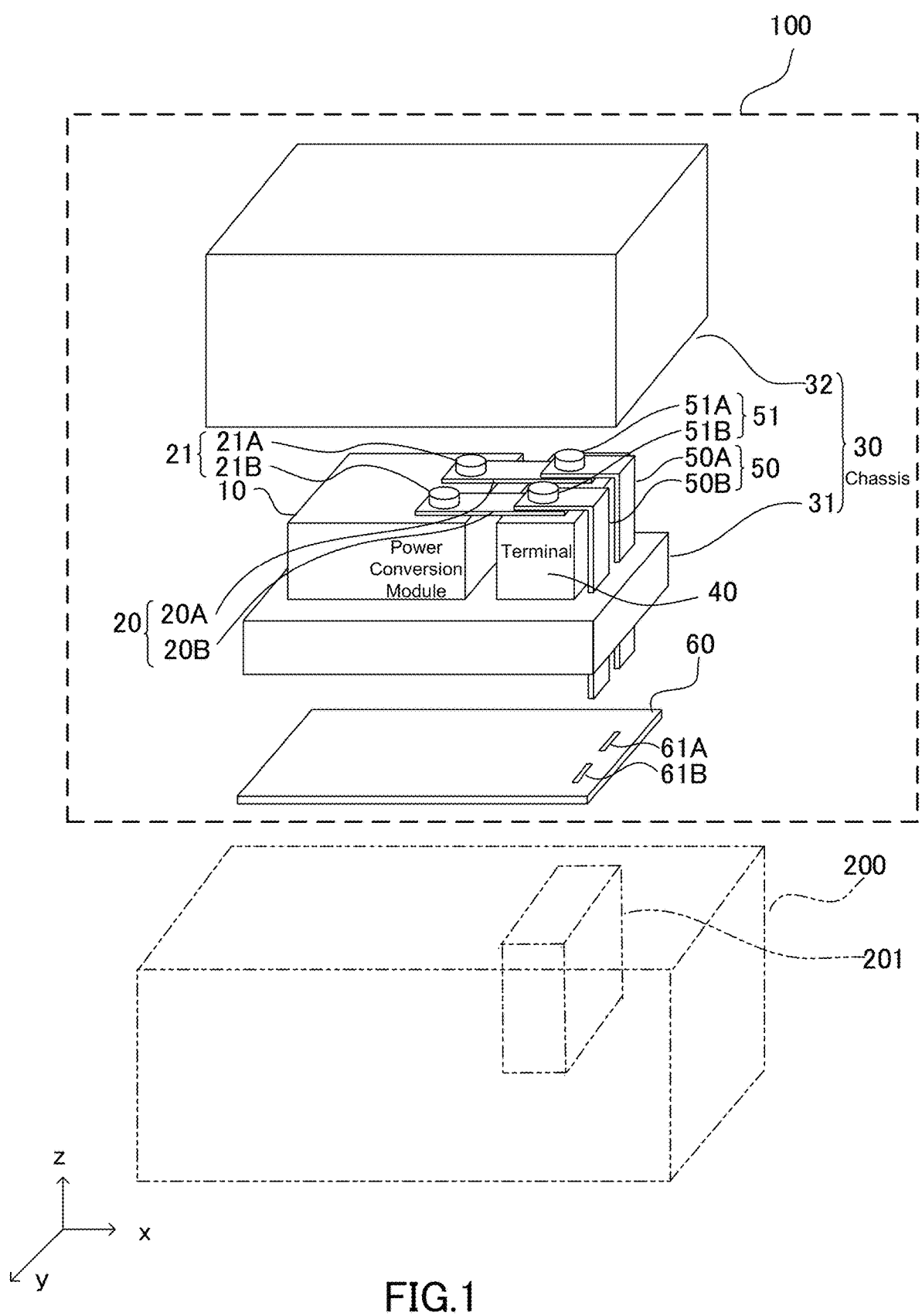
FIG. 1 is an exploded perspective view of a power conversion unit of a first embodiment.

FIG. 1 is an exploded perspective view of a power conversion unit of a first embodiment. In this figure, a direction from the left to the right in the figure is referred to as an X axis, a direction from the right deep side to the front left side in the figure is referred to as a y axis, and a direction from the bottom to the top in the figure is referred to as a z axis.

A power conversion unit 100 configures an integrated unit with an external device 200. For example, when the external device 200 is a motor, a motor unit is configured by the power conversion unit 100 and the external device 200.

The power conversion unit 100 has a power conversion module 10, first bus bars 20 connected to terminals of the power conversion module 10, a chassis 30 housing the power conversion module 10, a terminal 40 connecting bus bars, second bus bars 50 connected to terminals of the external device 200, and a shield 60 suppressing noise between the power conversion unit 100 and the external device 200.

The power conversion module 10 is configured by an inverter and performs conversion between direct current power and alternating current power. For example, the power conversion module 10 converts direct current power input from a battery (not illustrated) to alternating current power, and then outputs the converted alternating current power to the external device 200. This figure illustrates two bus bars on an output side but three or more bus bars may be provided as bus bars on the output side. The terminals of the power conversion module 10 are connected to first bus bars 20A, 20B by fastening by first bolts 21A, 21B. The power conversion module 10 is fixed to the upper surface of a bottom portion 31 of the chassis 30.

The chassis 30 contains the bottom portion 31 formed of a resin and a box portion 32 formed of a metal. The bottom portion 31 is formed of an engineering plastic resin, such as polyamide, for example. The box portion 32 is manufactured by die casting using a metal material, such as aluminum. The box portion 32 is fixed to the bottom portion 31 to cover the power conversion module 10 and the terminal 40 provided on the bottom portion 31.

The terminal 40 is formed of a resin and is configured integrally with the bottom portion 31 of the chassis 30. The terminal 40 connects the first bus bars 20A, 20B connected to the power conversion module 10 and second bus bars 50A, 50B connected to the external device 200 by fastening by second bolts 51A, 51B on the terminal 40.

The first bus bars 20A, 20B and the second bus bars 50A, 50B are plate-like metal members containing tough pitch copper or the like. The second bus bars 50A, 50B each are configured into an L shape having a bent portion. The first bus bars 20A, 20B and the second bus bars 50A, 50B are provided with bolt holes through which bolts pass in the fastening by the bolts in the vicinity of both ends thereof.

The power conversion module 10 and the terminal 40 are provided with screw grooves screwable to the first bolts 21A, 21B and the second bolts 51A, 51B.

In the first bus bars 20A, 20B, due to the fact that the first bolts 21A, 21B provided to pass through the bolt holes provided in left portions of the first bus bars 20A, 20B in the figure are screwed to the screw grooves of the power conversion module 10, the first bus bars 20A, 20B are fastened to the power conversion module 10. End portions on the right side (x-axis positive direction side) of the figure of the first bus bars 20A, 20B and end portions on the left side (x-axis negative direction side) of the figure of the second bus bars 50A, 50B are stacked such that the bolt holes provided in both of the first bus bars 20A, 20B and the second bus bars 50A, 50B are overlapped with each other. Then, the second bolts 51A, 51B are passed through the bolt holes of the first bus bars 20A, 20B and the bolt holes of the second bus bars 50A, 50B disposed in an overlapping manner to be screwed to the screw grooves of the terminal 40. Thus, the first bus bars 20A, 20B and the second bus bars 50A, 50B are fastened to each other.

The shield 60 is formed of a metal, such as iron or aluminum, and is manufactured by combining a press method and welding as appropriate. The shield 60 is fixed to cover the undersurface of the bottom portion 31 and shields noise propagating between the power conversion module 10 and the external device 200. The shield 60 is provided with openings 61A, 61B. The second bus bars 50A, 50B pass through the openings 61A, 61B to reach the external device 200 side.

The external device 200 has a recessed portion 201 having an opening in the upper surface (surface on the z-axis positive direction side). In the recessed portion 201, the second bus bars 50A, 50B are electrically connected to the external device 200.

Figure 2:
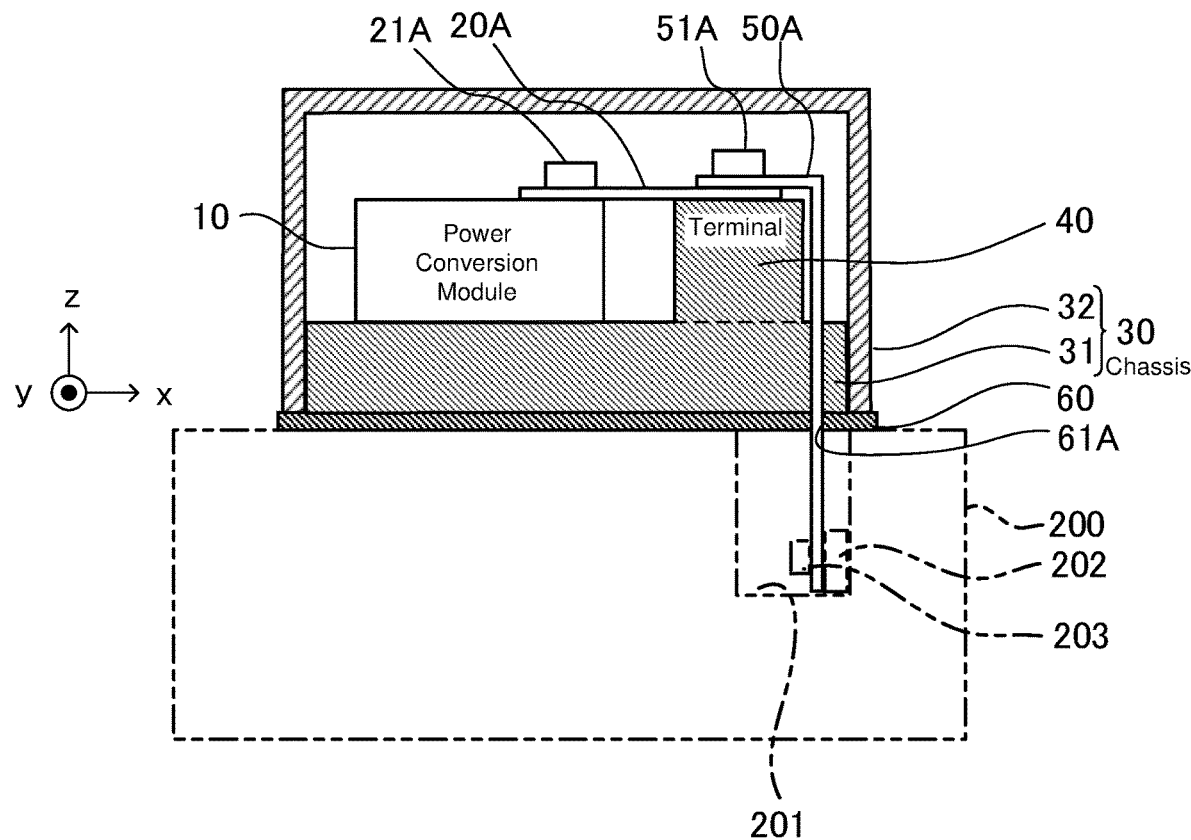
FIG. 2 is a cross-sectional view of the power conversion unit.

FIG. 2 is a cross-sectional view in an xz plane of the power conversion unit 100 along the first bus bar 20A and the second bus bar 50A.

According to this figure, the L-shaped second bus bar 50A passes through the opening 61A of the shield 60 to extend into the recessed portion 201 of the external device 200. The second bus bar 50A is fastened to a connection terminal 202 provided in the recessed portion 201 by a third bolt 203 to be electrically connected to the connection terminal 202.

As a comparative example, an example in which the terminal 40 and the bottom portion 31 of the chassis 30 are separately formed is described.

Figure 3:
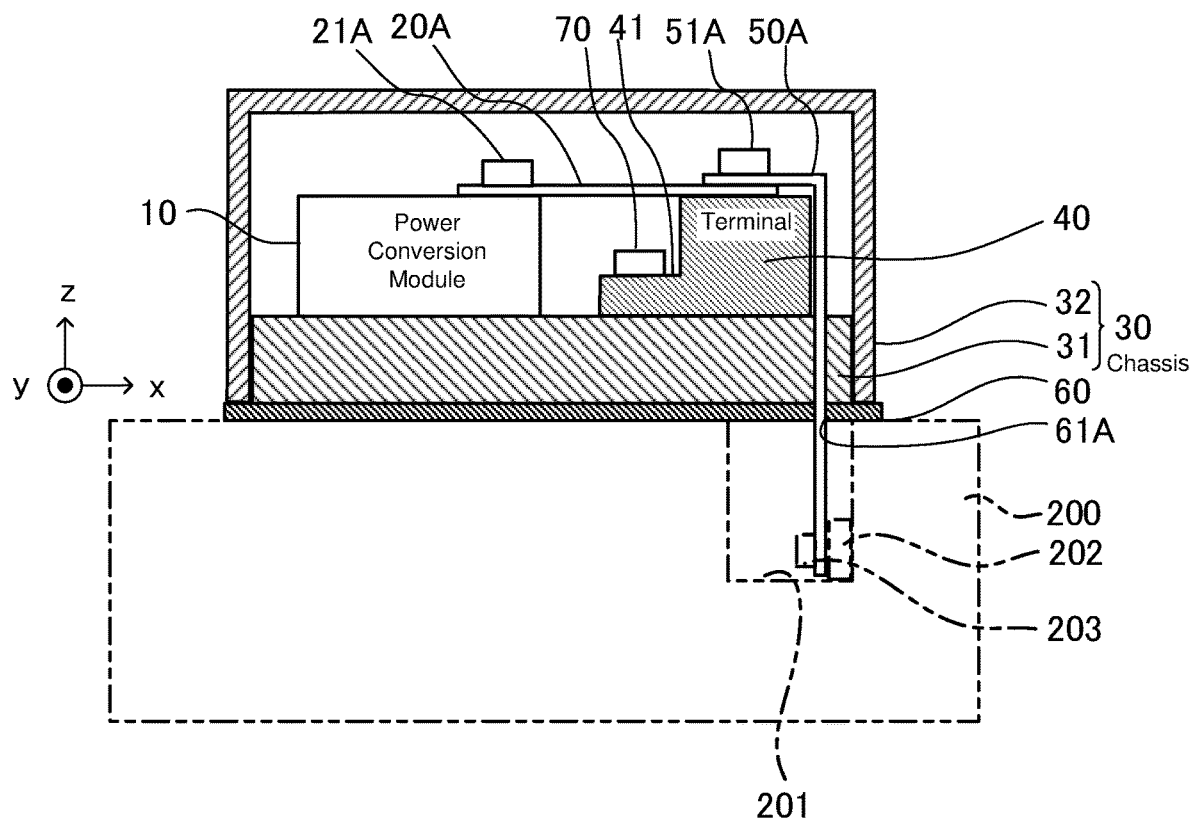
FIG. 3 is a cross-sectional view of a power conversion unit of a comparative example.

FIG. 3 is a cross-sectional view of the power conversion unit 100 in the xz plane in the comparative example. The terminal 40 and the bottom portion 31 are separately provided. The bottom portion 31 is formed of a metal as with the box portion 32.

As illustrated in this figure, the terminal 40 has a flange 41 provided with a bolt hole. A fourth bolt 70 passes through the hole of the flange 41 to be screwed to a screw groove provided in the bottom portion 31, so that the terminal 40 is fixed to the bottom portion 31. Due to such a configuration, the power conversion unit 100 increases in length in the x-axis direction corresponding to the width of the flange 41 used for the fastening by the fourth bolt 70.

Although not illustrated, a terminal is separately provided also on an input side of the power conversion module 10. This terminal is formed of a resin integrally with the terminal 40 and the bottom portion 31.

The first embodiment configured as described above can obtain the following effects.

In the power conversion unit 100 of the first embodiment, the first bus bars 20A, 20B connected to the power conversion module 10 and the second bus bars 50A, 50B connected to the external device 200 are connected to each other on the terminal 40. Both the terminal 40 and the bottom portion 31 of the chassis 30 are integrally formed of a resin.

When the bottom portion 31 and the terminal 40 are separately configured as in the comparative example illustrated in FIG. 3, the terminal 40 needs to have the flange 41 used for the fastening by the fourth bolt 70 in order to fix the terminal 40 to the bottom portion 31. Therefore, the power conversion unit 100 increases in size corresponding to the width (x-axis direction) of the flange 41.

Whereas, in this embodiment, the terminal 40 and the bottom portion 31 are integrally formed. Therefore, the flange 41 which is a configuration fastening the terminal 40 and the bottom portion 31 as in the comparative example becomes unnecessary, which enables a reduction in the size of the power conversion unit 100. Furthermore, the fastening by the fourth bolt 70 in the flange 41 of the terminal 40 becomes unnecessary, which simplifies the configuration, and thus the component cost and the manufacturing cost can be reduced.

Moreover, by resinifying the bottom portion 31, the distance between the first bus bars 20A, 20B and the second bus bars 50A, 50B fastened to each other on the terminal 40 and the bottom portion 31 is sufficiently large, which eliminates the necessity of considering the insulation as compared with the case where the bottom portion 31 is formed of a metal, and therefore the terminal 40 can be reduced in size. Moreover, due to the fact that the bottom portion 31 is configured using a resin, a reduction in the thickness and weight of the bottom portion 31 can be achieved.

Second Embodiment

The first embodiment illustrates an example in which the terminal 40 is disposed on a side where the power conversion module 10 is provided with respect to the bottom portion 31 of the chassis 30, i.e., upper surface side (z-axis positive direction side) of the bottom portion 31, and disposed inside the box portion 32 of the chassis 30. A second embodiment describes an example in which the terminal 40 is disposed on a side where the external device 200 is provided with respect to the bottom portion 31, i.e., undersurface side (z-axis negative direction side) of the bottom portion 31, and disposed outside the box portion 32.

Figure 4:
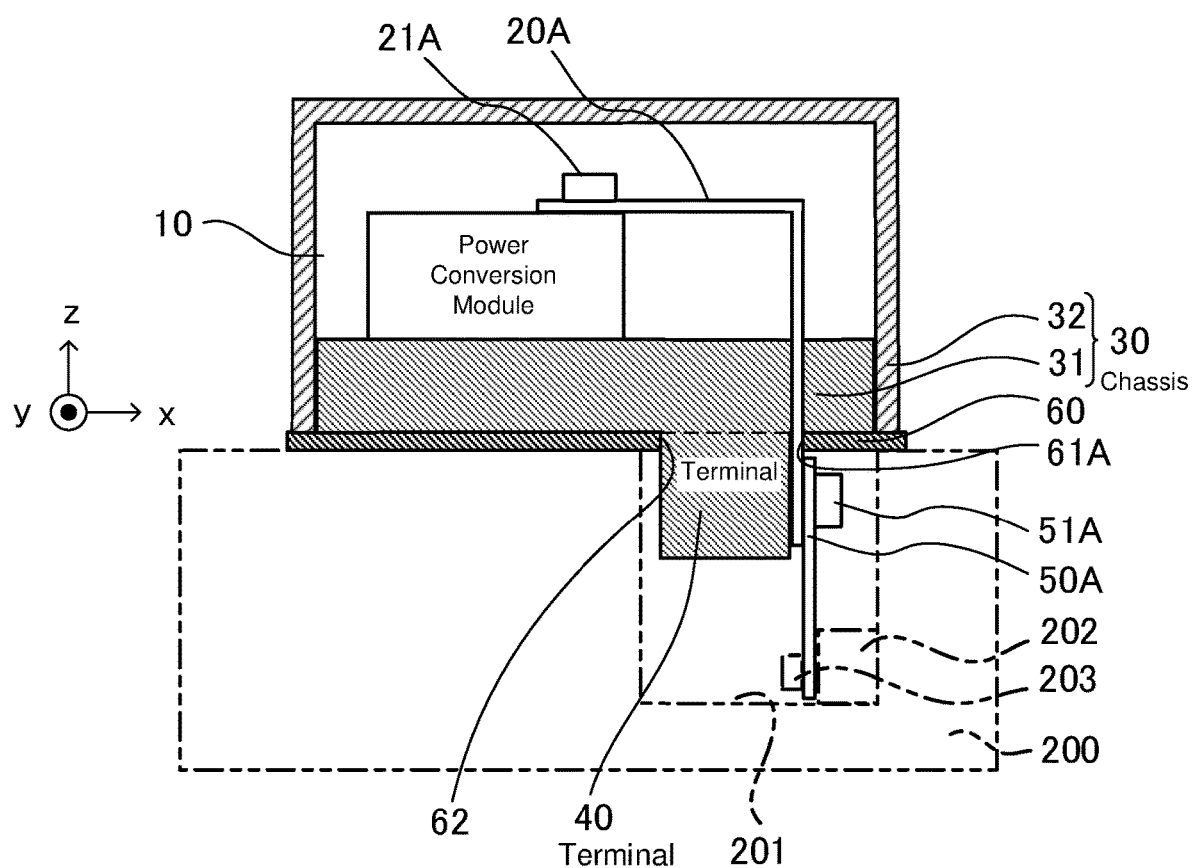
FIG. 4 is a cross-sectional view of a power conversion unit of a second embodiment.

FIG. 4 is a cross-sectional view of the xz plane of the power conversion unit 100 of the second embodiment.

The terminal 40 is provided integrally with the bottom portion 31 on a side (z-axis negative side) where the external device 200 is provided with respect to the bottom portion 31. The shield 60 has an opening 62 having a cross section substantially equal to that of the terminal 40. The terminal 40 passes through the opening 62 of the shield 60 to be located in the recessed portion 201 of the external device 200.

The first bus bar 20A is configured into an L shape having a bent portion. In the recessed portion 201, the first bus bar 20A and the second bus bar 50A are fastened to the terminal 40 by the second bolts 51.

The following effects can be obtained by the second embodiment configured as described above.

According to the power conversion unit 100 of the second embodiment, the power conversion module 10 and the terminal 40 are disposed on opposite sides with respect to the bottom portion 31, i.e., disposed outside the box portion 32. Therefore, as compared with the first embodiment illustrated in FIG. 2, the power conversion module 10 and the terminal 40 can be disposed close to each other in the longitudinal direction (x-axis direction) in the surface of projection in the thickness direction (z-axial direction) of the bottom portion 31, and thus the power conversion unit 100 can be reduced in size.

According to the power conversion unit 100 of the second embodiment, the terminal 40 provided on the undersurface (surface on the z-axis negative direction side) of the bottom portion 31 is housed in the recessed portion 201 of the external device 200 when an integrated unit of the power conversion unit 100 and the external device 200 is configured. When such an integrated unit is assembled, the first bus bars 20 and the second bus bars 50 connected to the external device 200 can be fastened to each other using the second bolts 51 in a state where the chassis 30 is configured by connecting the bottom portion 31 and the box portion 32. Therefore, when the power conversion unit 100 and the external device 200 are connected to each other, the chassis 30 is already assembled. Hence, the entrance of foreign substances, such as wastes or dust, into the power conversion unit 100 can be prevented and the handling is facilitated, so that a manufacturing process can be simplified.

Third Embodiment

The first and second embodiments describe an example in which nothing is provided between a first bus bar 20A and a first bus bar 20B and between the second bus bar 50A and the second bus bar 50B. A third embodiment describes an example in which an insulating member containing a resin is provided between the first bus bar 20A and the first bus bar 20B and between the second bus bar 50A and the second bus bar 50B.

Figure 5A:
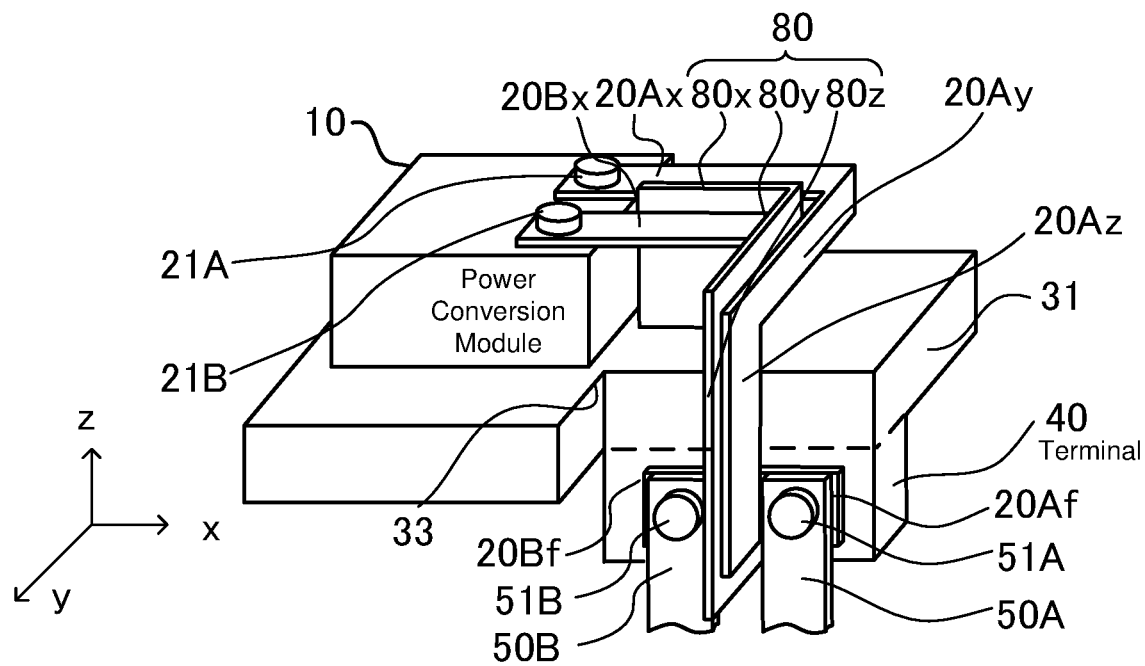
FIG. 5A is a perspective view of a part of a power conversion unit of a third embodiment.

FIG. 5A is a perspective view of a part of the power conversion unit 100 of the third embodiment.

Figure 5B:
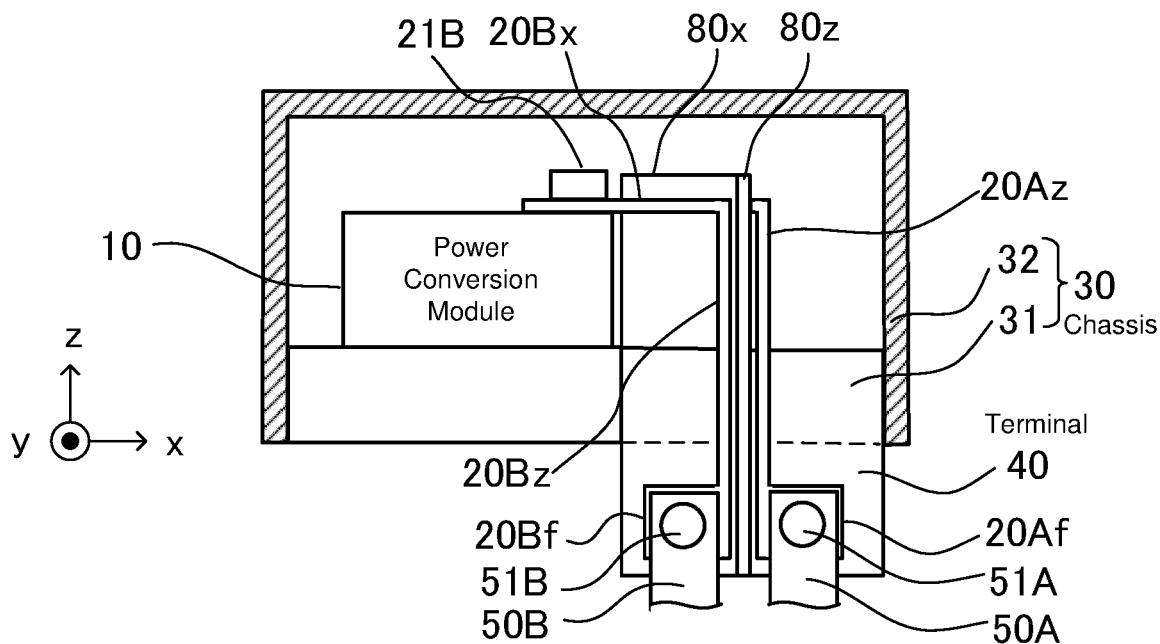
FIG. 5B is a cross-sectional view of the power conversion unit.

FIG. 5B is a figure of the power conversion unit 100 viewed from the y-axis positive direction side.

Figure 5C:
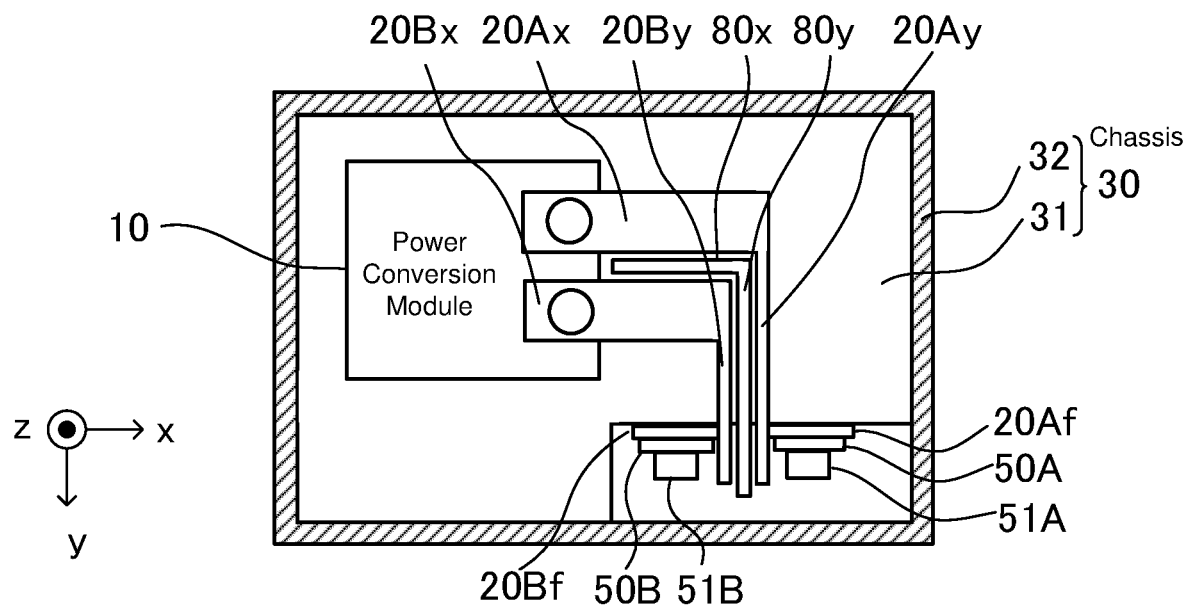
FIG. 5C is a cross-sectional view of the power conversion unit.

FIG. 5C is a figure of the power conversion unit 100 viewed from the x-axis positive direction side.

As illustrated in these figures, a notch 33 extending in the z-axis direction is provided in a corner portion in the plane in the xy direction of the bottom portion 31. The terminal 40 is provided to be flush with the inner surface in the y-axis direction of the notch 33.

The first bus bar 20A is configured by bending of a plate-like member having bending portions with equal widths at the bending portions and has a first bus bar 20Ax extending in the x-axis direction, a first bus bar 20Ay extending in the y-axis direction, a first bus bar 20Az extending in the z-axis direction, and a first bus bar fastening portion 20Af provided in the xz-plane direction. The first bus bar fastening portion 20Af is provided with a bolt hole through which the second bolt 51A passes.

The first bus bar 20B has a first bus bar 20Bx extending in the x-axis direction, a first bus bar 20By extending in the y-axis direction, a first bus bar 20Bz extending in the z-axis direction, and a first bus bar fastening portion 20Bf provided in the xz-plane direction. The first bus bar fastening portion 20Bf is provided with a bolt hole through which the second bolt 51B passes.

The first bus bar fastening portion 20Af and the second bus bar 50A are fastened to each other by the second bolt 51A. The first bus bar fastening portion 20Bf and the second bus bar 50B are fastened to each other by the second bolt 51B.

Between the first bus bar 20A and the first bus bar 20B, a wall portion 80 is provided. The wall portion 80 is formed of a resin integrally with the bottom portion 31 and the terminal 40. The wall portion 80 has a wall portion 80x extending in the x-axis direction, a wall portion 80y extending in the y-axis direction, and a wall portion 80z extending in the z-axis direction.

The first bus bar 20Ax and the first bus bar 20Bx adjacent to each other in the y-axis direction are insulated by the wall portion 80x extending in the x-axis direction and having a height in the z-axis direction. The first bus bar 20Ay and the first bus bar 20By adjacent to each other in the x-axis direction are insulated by the wall portion 80y extending in the y-axis direction and having a height in the z-axis direction. The first bus bar 20Az and first bus bar 20Bz adjacent to each other in the x-axis direction are insulated by the wall portion 80z extending in the z-axis direction and having a width in the y-axis direction.

The following effects can be obtained by the third embodiment configured as described above.

The power conversion unit 100 of the third embodiment is provided with the wall portion 80 formed integrally with the terminal 40 and the bottom portion 31 of the chassis 30. The wall portion 80 insulates between the first bus bar 20A and the first bus bar 20B and between the second bus bar 50A and the second bus bar 50B. The above-described configuration can reduce a possibility of the contact between the first bus bar 20A and the first bus bar 20B and the contact between the second bus bar 50A and the second bus bar 50B due to an impact, unexpected adhesion of a conductive member, or the like as compared with a case where the wall portion 80 is not provided.

Furthermore, the wall portion 80 is formed of a resin integrally with the bottom portion 31 and the terminal 40, and therefore the degree of freedom of arrangement is high. Hence, the wall portion 80 can be disposed at a desired place between the power conversion module 10 and the terminal 40 without being limited to the vicinity of fastened points by the second bolts 51A, 51B.

Furthermore, the fastening by the second bolts 51A, 51B is performed in a state where the second bolts 51A, 51B are pressed against the terminal 40 in the y-axis negative direction. However, the terminal 40 is further configured integrally with the wall portion 80, and therefore the strength of the terminal 40 is increased, and thus manufacturing defects can be reduced. Specifically, the strength in the y-axis direction of the terminal 40 can be increased due to the fact that the terminal 40 is integrated with the wall portion 80z having a width in the y-axis direction.

Fourth Embodiment

The first to third embodiments describe an example in which the power conversion module 10 is air-cooled but the present invention is not limited thereto. A fourth embodiment describes an example in which a refrigerant flow path is provided in the bottom portion 31 of the chassis 30 or the like and the power conversion module 10 is cooled with a refrigerant.

Figure 6:
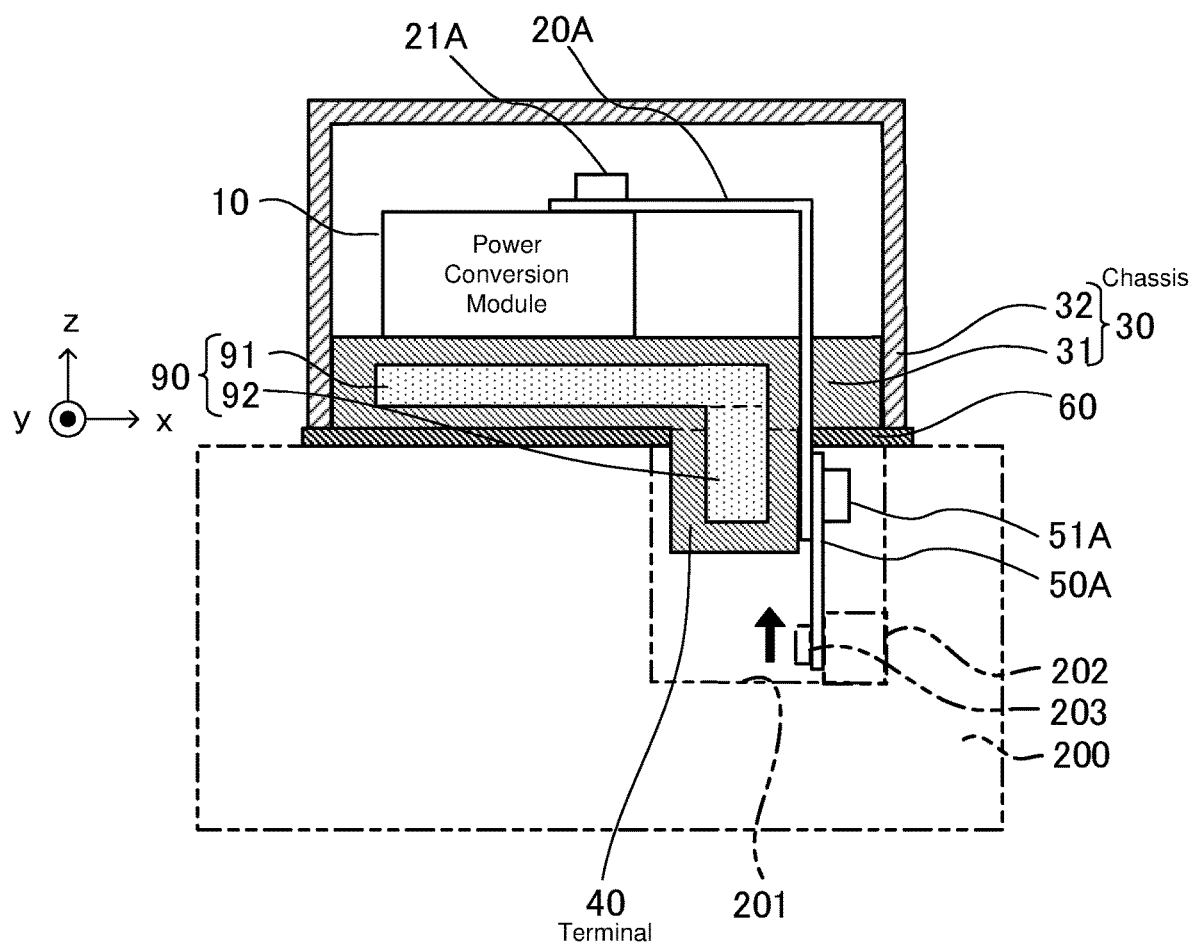
FIG. 6 is a cross-sectional view of a power conversion unit of a fourth embodiment.

FIG. 6 is a cross-sectional view in the xz plane of the power conversion unit 100 of the fourth embodiment.

As illustrated in this figure, the bottom portion 31 of the chassis 30 and the terminal 40 are provided with a refrigerant flow path 90 configured integrally therewith. More specifically, a first flow path 91 having a thickness in the z direction and provided in the xy plane direction in the bottom portion 31 and a second flow path 92 provided to extend in the z-axis direction in the terminal 40 and the bottom portion 31 are provided. The flow path 90 is connected to an inflow port (not illustrated) and an outflow port (not illustrated) communicating with the outside of the chassis 30 and the terminal 40 and is configured to be able to circulate a refrigerant between the chassis 30 and the terminal 40 and a cooling device (not illustrated) provided outside through the inflow port and the outflow port. Due to the fact that the flow path 90 is configured as described above, the power conversion module 10 is cooled through the upper surface of the bottom portion 31 and the first bus bars 20A, 20B and the second bus bars 50A, 50B are cooled through the terminal 40.

Figure 7:
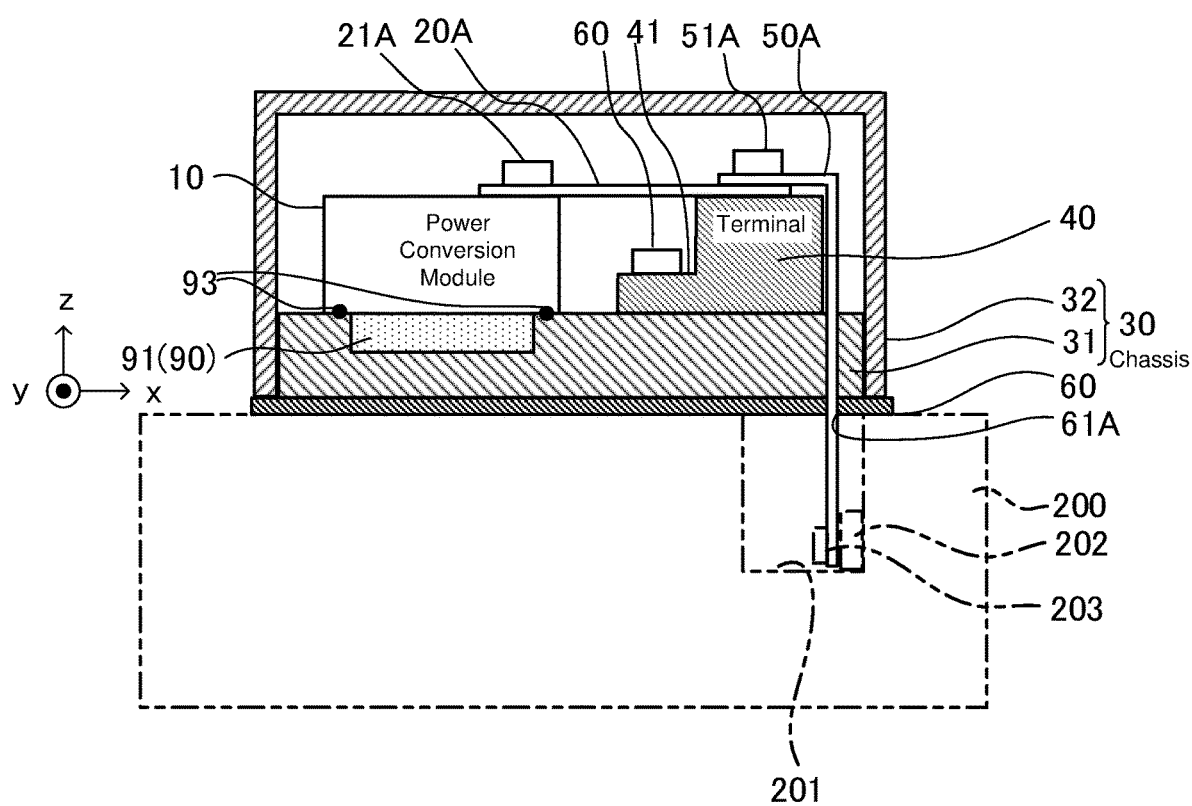
FIG. 7 is a cross-sectional view of a power conversion unit of a comparative example.

FIG. 7 is a cross-sectional view of the power conversion unit 100 of a comparative example. In this comparative example, the bottom portion 31 is provided as a separate metal body as with the comparative example illustrated in FIG. 3. Since the bottom portion 31 is formed of a metal, it is difficult to provide the first flow path 91 inside the bottom portion 31. Therefore, an opening or a groove is formed to contact the bottom surface of the power conversion module 10 in the upper surface (surface on the z-axis positive direction side) of the bottom portion 31. The opening or the groove is used as the first flow path 91. In the interface between the power conversion module 10 and the bottom portion 31, a sealing member 93 is provided to surround the flow path 90 in order to prevent the leakage of a refrigerant. Whereas, in this embodiment, due to the fact that the first flow path 91 is provided inside the bottom portion 31 and the terminal 40 which are integrally configured, the sealing member 93 is not required.

The following effects can be obtained by the fourth embodiment configured as described above.

According to the power conversion unit 100 illustrated in the fourth embodiment, due to the fact that the bottom portion 31 is formed of a resin integrally with the terminal 40, it becomes relatively easy to provide the flow path 90 inside the bottom portion 31 and the terminal 40 as compared with the case where the bottom portion 31 is formed of a metal.

Moreover, as compared with the comparative example of FIG. 7 in which the bottom portion 31 has the first flow path 91 opened to the upper surface, the sealing member 93 is not required, so that the configuration can be simplified. Moreover, the necessity of bringing the flow path 90 into contact with the power conversion module 10 is eliminated, so that the degree of freedom in design of the flow path 90 can be improved.

Moreover, heat transmitted from the external device 200 is cooled in the terminal 40 before reaching the power conversion module 10 which is a precision instrument through the second bus bars 50. Therefore, the power conversion unit 100 having a high permissible limit temperature and high performance and the external device 200 having a large heat generation amount and a high output can be combined. Hence, an improvement of the performance of a unit containing the power conversion unit 100 and the external device 200 can be realized.

First Modification

In the fourth embodiment, the bottom portion 31 of the chassis 30 and the terminal 40 are provided with the flow path 90 configured integrally therewith but the present invention is not limited thereto. A first modification describes another configuration of the flow path 90.

Figure 8:
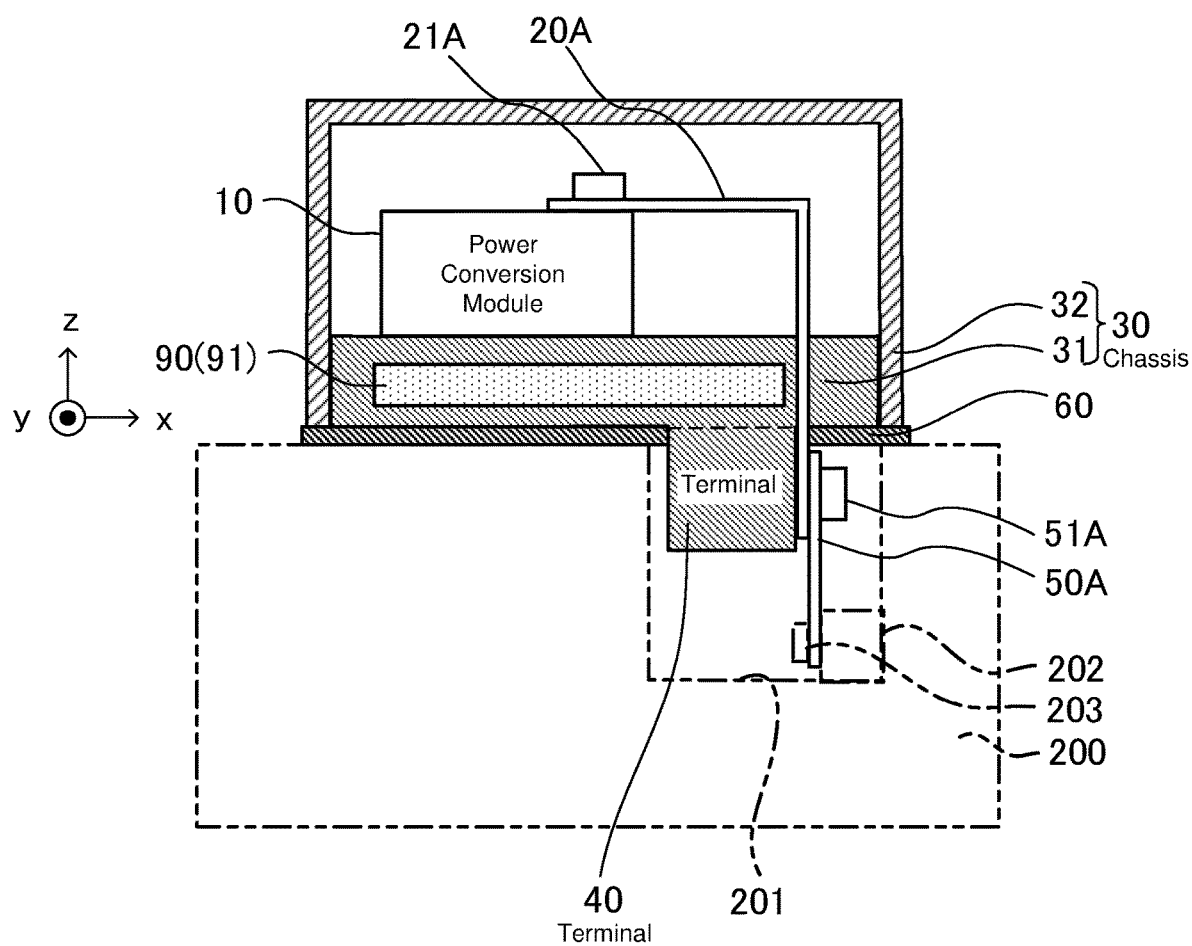
FIG. 8 is a cross-sectional view of a power conversion unit of a first modification.

FIG. 8 is a cross-sectional view in the xz plane of the power conversion unit 100 of the first modification.

According to this figure, the second flow path 92 provided in the terminal 40 is omitted as compared with the fourth embodiment illustrated in FIG. 6. The first flow path 91 provided in the bottom portion 31 is extended to the vicinity of the terminal 40, and therefore the terminal 40 formed integrally with the bottom portion 31 is cooled, so that an increase in the temperature of the first bus bars 20A, 20B is suppressed.

According to the power conversion unit 100 of such a first modification, even when the second flow path 92 illustrated in FIG. 6 is not provided in the terminal 40, the terminal 40 is cooled by the first flow path 91 extended to the vicinity of the terminal 40. Therefore, the configuration of the terminal 40 can be simplified and an improvement of the performance of an integrated unit by blocking of the heat conduction between the power conversion unit 100 and the external device 200 can be achieved.

Second Modification

The first modification describes the example in which the terminal 40 does not have the second flow path 92. A second modification describes another configuration in a case where the terminal 40 does not have the second flow path 92.

Figure 9:
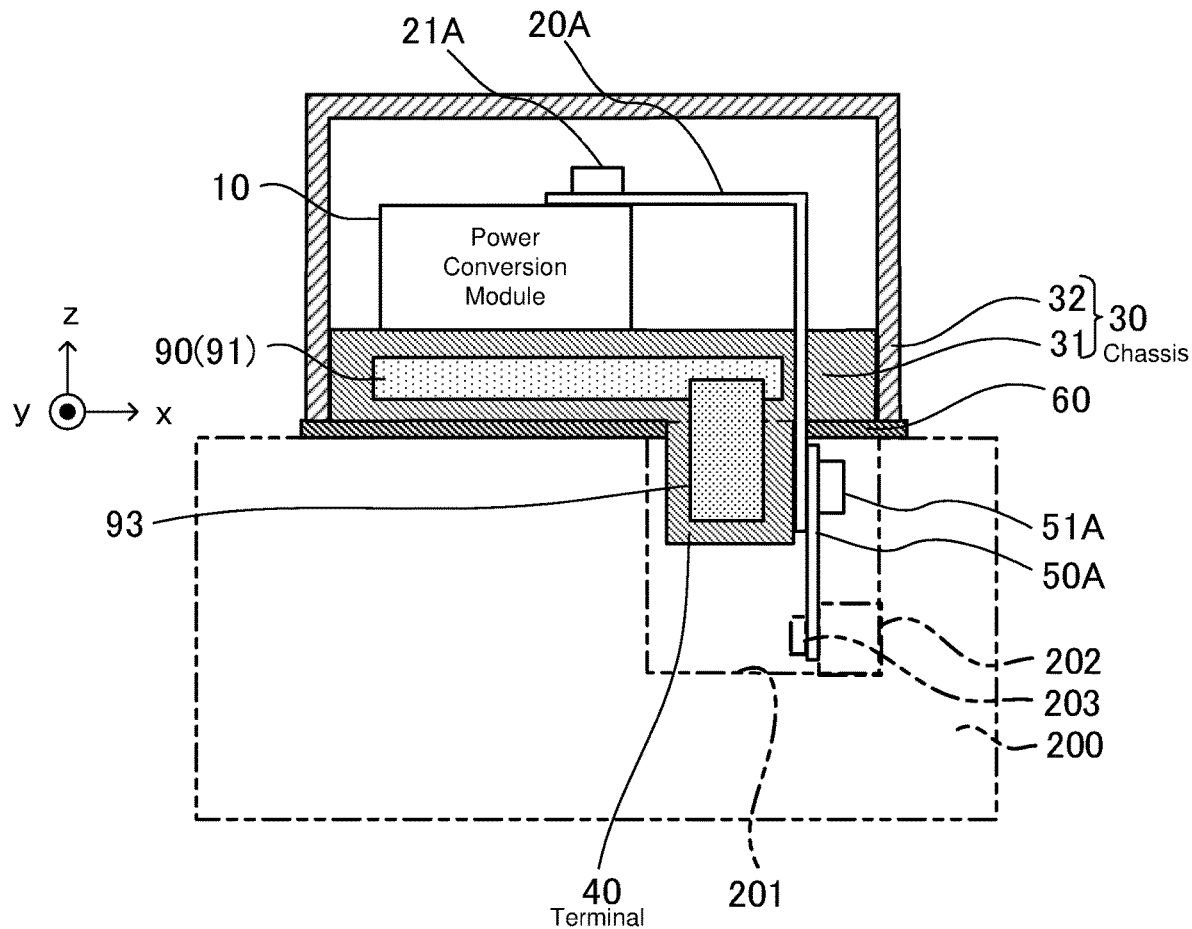
FIG. 9 is a cross-sectional view of a power conversion unit of a second modification.

FIG. 9 is a cross-sectional view in the xz plane of the power conversion unit 100 of the second modification.

According to this figure, a metal body 93 reaching the inside of the first flow path 91 is provided in the terminal 40 as compared with the first modification illustrated in FIG. 8.

According to the power conversion unit 100 of such a second modification, the metal body 93 is provided in the terminal 40, and therefore the strength of the terminal 40 increases as compared with the case where the second flow path 92 is provided as illustrated in FIG. 6, and thus the deformation in fastening by the second bolt 51A can be suppressed. Furthermore, due to the fact that the metal body 93 containing a metal having high thermal conductivity reaches the first flow path 91, the terminal 40 is cooled through the metal body 93, and therefore an increase in the temperature of the first bus bars 20A, 20B is suppressed, so that an improvement of the performance of an integrated unit can be achieved.

As described above, the embodiments of the present invention are described. However, the embodiments merely exemplify some of application examples of the present invention and do not intend to limit the technical scope of the present invention to the specific configurations of the embodiments described above. The above-described embodiments can be combined as appropriate.

The invention claimed is:

1. A power conversion unit comprising:
    a power conversion module configured to perform conversion between direct current power and alternating current power;
    a first bus bar connected to the power conversion module and configured to input and output the power converted by the power conversion module;
    a second bus bar configured to be connected to an external device;
    a chassis housing the power conversion module;
    a terminal portion extending from part of the chassis, wherein the terminal portion and said part of the chassis are integrally formed of a resin; and a fastener that fastens the first and second bus bars to the terminal portion such that the first and second bus bars are sandwiched between the terminal portion and a head of the fastener.

2. The power conversion unit according to claim 1, wherein the terminal portion is provided outside the chassis.

3. The power conversion unit according to claim 2, wherein the terminal portion is housed inside a recessed portion provided in the external device.

4. The power conversion unit according to claim 1, further comprising:
   a first set of two or more bus bars connected to the power conversion module, the first set including the first bus bar;
   a second set of two or more bus bars connected to the first set of two or more bus bars, the second set including the second bus bar; and
   a wall portion integrally formed of the resin with the terminal portion and the at least a part of the chassis and insulating between two bus bars in the first set and between two bus bars in the second set.

5. The power conversion unit according to claim 1, wherein a flow path through which a refrigerant flows is formed inside the chassis and the terminal portion.

6. The power conversion unit according to claim 1, wherein;
   a flow path through which a refrigerant flows is formed inside the chassis, and
   the flow path is extended to a vicinity of the terminal portion.

7. The power conversion unit according to claim 6, wherein:
   the terminal portion has a metal body inside, and
   the metal body reaches the flow path.

8. The power conversion unit according to claim 1, wherein the second bus bar extends through the resin of the chassis from inside the chassis to outside the chassis.

* * * * *